United States Patent
Price et al.

[11] Patent Number: 5,885,717
[45] Date of Patent: Mar. 23, 1999

[54] CIRCUIT PROTECTION FILM

[75] Inventors: Jack L. Price; James N. Kellen, both of Austin, Tex.

[73] Assignee: Minnesota Mining and Manufacturing Company, St. Paul, Minn.

[21] Appl. No.: 7,556

[22] Filed: Jan. 15, 1998

[51] Int. Cl.⁶ .................................................. B32B 27/00
[52] U.S. Cl. ..................... 428/473.5; 528/271; 526/72; 526/75; 526/238.3; 526/285; 526/317.1; 526/318; 428/476.3; 428/476.9; 428/483; 428/349
[58] Field of Search ............................. 528/271; 526/72, 526/75, 238.3, 285, 317.1, 318; 428/473.5, 476.3, 476.9, 483, 349

[56] References Cited

U.S. PATENT DOCUMENTS

| | | | |
|---|---|---|---|
| 4,066,820 | 1/1978 | Kelly et al. | 428/483 |
| 4,737,559 | 4/1988 | Kellen et al. | 526/291 |
| 4,985,488 | 1/1991 | Landin | 524/555 |

FOREIGN PATENT DOCUMENTS

| | | |
|---|---|---|
| 49-01360 B | 4/1974 | Japan . |
| 57167254 A | 4/1981 | Japan . |
| 63-227334 A | 9/1988 | Japan . |
| 03140380 A | 10/1989 | Japan . |
| 4251931 | 9/1992 | Japan . |
| 06184521 A | 12/1992 | Japan . |
| 06340848 A | 8/1993 | Japan . |
| 7216334 A | 8/1995 | Japan . |

*Primary Examiner*—Samuel A. Acquah
*Attorney, Agent, or Firm*—Darla P. Fonseca

[57] ABSTRACT

A composite tack-free film having a film substrate with opposing surfaces, bearing on at least one of said surfaces a highly crosslinked, film-forming acrylate composition containing from about 25 to about 78 of at least one lower alkyl (meth)acrylate ester and from about 10 to about 60 percent vinyl acetate and at least about 1 percent of a polar monomer, wherein the acrylate composition is capable of attaching temporarily to polyimide film surface to provide a substantially air-tight seal and being cleanly removable from said polyimide film surface leaving no visible residue, even after being subjected to elevated temperatures.

7 Claims, No Drawings

CIRCUIT PROTECTION FILM

BACKGROUND OF THE INVENTION

1. Field of the Invention

The invention relates to composite films having surface contact characteristics useful for temporary attachment to article surfaces during processing of such articles at high temperatures without significant increase in the force of attachment. Films of the invention facilitate device manufacturing operations associated with electronic microdevice assembly.

2. Description of the Related Art

Assembly of electronic microdevices is complex and includes a variety of physical and chemical processing steps which are performed upon smaller and smaller circuits. In fabricating, for example, a printed circuit supporting integrated circuit chips, it is necessary to protect or mask certain portions of the printed circuit while performing required processing steps such as the application of photoresist, soldering or encapsulating to a circuit which is on the order of a few millimeters in total size.

A masking material, typically an adhesive masking tape, limits application of fluid treatments to designated areas of the printed circuit. Most adhesive-type masking tapes, whilst fulfilling the requirement of confining treatments to desired areas, have the potential to cause problems after completion of the step requiring their use. This is primarily due to the difficulty in removing the tape. A tacky adhesive, used for tape attachment, typically has more affinity for the surface to which it is adhered than it has cohesive characteristics, especially when the process step requires heat, which tends to increase adhesion. At the time of removal, the adhesive frequently has insufficient cohesive strength for clean removal from the surface, resulting in contamination of the printed circuit surface. This transfer of adhesive to the surface of the printed circuit produces an area of contamination capable of capturing particulates or chemical components that could prevent the circuit assembly from functioning effectively. It is highly desirable for an adhesive in electronic component masking to separate from the protected surface without leaving any residual adhesive. This is extremely difficult to accomplish considering that formulation of adhesives primarily focuses on the need for measurable tack or stickiness when applying the adhesive. Even crosslinked adhesives, with higher cohesive properties, are subject to some adhesive transfer due to their tendency to flow, especially if part of the circuit assembly process includes a high temperature step.

Adhesive tapes are disclosed for use as masking tapes in electronic processing methods in JP 4251931 where a tape consisting of a substrate film layer composed of polypropylene or poly(ethylene terephthalate) having an adhesive layer coated thereon is used to protect the front side of a semiconductor wafer from acid treatment.

In JP 7216334 a film composition containing a polymer with at least 20% 2-acryloyloxyethyl succinic acid is used as a support for a protective film or tape to masking electronic parts.

Other references, including JP 6340848, JP 6184521, JP 3140380, JP 63227334, JP 57167254 and JP 74013630, disclose protective films which prevent surface damage to planar structures made from a variety of materials with emphasis on glass, metal and plastic plates. These protective films cover the total area of the underlying plate and remain in attachment with the surface of the plate until removal of the film. There is no disclosure or evidence to show that these films seal the gap between the film and a plate surface to prevent ingress of fluids as is required of protective masking films suitable for electronic circuit processing. Also neither clean removal nor high temperature performance appear to be requirements for films used to protect polished surfaces of plates.

U.S. Pat. No. 4,737,559 discloses a crosslinked adhesive which is controlled through the addition of a free radically polymerizable photocrosslinker to an alkyl acrylate and methacrylate for adhesion and to skin and removal therefrom.

Effective processing and prevention of surface contamination introduced by masking films used in processing electronic circuits requires a material which will provide good temporary adhesion or attachment to the circuit as well as a residue-free separation from selected areas of a printed circuit, even after exposure to heat.

The current invention provides a temporary attachment material in the form of a composite, tack-free film having an affinity for attachment to printed circuit surfaces. Because the surface which contacts the printed circuit is part of a continuous film, free of the fluid characteristics of an adhesive, it releases cleanly, and no residue remains on the circuit after removal of the composite film.

SUMMARY OF THE INVENTION

The invention provides a dimensionally stable, composite film suitable for use in assembly of electronic circuits involving process steps that include chemical treatments and high temperature operations. Films of the invention become attached to selected areas of printed circuits to mask those areas and seal out any potentially contaminating components of the various treatments occurring during the assembly process. Some of the treatments proceed at elevated temperature requiring minimal change, if any, in the attachment force between the masking film and the printed circuit material. After fulfilling its function the masking film must detach readily without residue.

A preferred form of the invention provides a composite film, comprising a polyethylene terephthalate substrate having opposing surfaces, with at least one of the surfaces supporting a highly crosslinked, tack-free acrylate composition. This film is useful for attachment to a polyimide film to provide a substantially air-tight seal and thereafter easy removal of the composite film from the polyimide film.

Films of this type survive processing temperatures up to and including 180° C. for about 1 hour with minimal evidence of dimensional change or increase in the force of attachment between the film and the surface of a printed circuit.

The following terms provide additional information about the current invention.

1. The term "attachment force" means the force of holding one surface to another.

2. The term "cohesion" means the internal force or strength that holds adjacent molecules of a single material together.

3. The term (meth)acrylate includes both a methacrylate and an acrylate.

4. The term "composite film" is a film having more than one layer, all of which layers are film layers, either the same or different.

5. The term "tack-free" means that the surface has no perceptible tack at room temperature.

6. The term "contact surface" means that at least one surface of films of the invention conforms to printed circuit contours, clinging with sufficient force of attachment to effective seal the interface between film and circuit to deny access by contaminants.

All percents, parts and ratios herein are by weight unless specifically otherwise noted.

DETAILED DESCRIPTION OF THE INVENTION

A process for the manufacture of electronic printed circuits includes multiple steps, some of which are applied only to portions of the circuit. Areas of the circuit not involved in a particular process step may need protection while the step is performed.

Composite films of the invention comprise a film forming composition with sufficient attachment force to printed circuits to satisfy requirements for protection and prevention of access by contaminants to protected areas. The surface of the film forming composition that attaches to the circuit may be referred to as the contact surface. Using a film having no adhesive-like fluid characteristics at the contact surface, minimizes the tendency for increase in the force of attachment during heating. Lack of attachment force increase is beneficial for residue-free removal of the film when its use as a circuit protecting film has been fulfilled. Surprisingly, the films of the invention also may be reattached after removal, and it will re-adhere to the surface in the same manner. This removal and reattachment may be performed multiple times without any noticeable change in attachment or removal properties.

The film forming composition may exist without support or reinforcement. However, in preferred form, the film, used to mask electronic circuits, is a composite film in which a film substrate supports the film composition that provides the contact surface. A primer layer may be interposed between the base film and the film forming composition.

Materials suitable for use as substrates include polyethylene terephthalate, polyimide, polyphenylene sulfide, fluorenone polyester and other films that remain essentially unchanged in contact with flexible circuit substrates at temperatures in range of 180° C. to 200° C. for periods of time up to about an hour. Films having thickness of from about 12 $\mu$m to about 250 $\mu$m are useful. Preferred substrates include pre-shrunk, polyethylene terephthalate film with a thickness of 25 $\mu$m.

Primers suitable for use on substrates of the invention include those having a rubber compound. Useful rubbery components include natural rubbers such as butyl rubbers, and various synthetic compounds, including but not limited to, acrylonitrile-butadiene, acrylonitrile-butadiene-styrene copolymers, styrene-butadiene-styrene, styrene-ethylene butylene-styrene, polychloroprene, polybutadiene, polyisoprene, styrene-isoprene-styrene, and mixtures thereof.

The primer may also contain an epoxy or a phenolic resin such as phenol formaldehyde resin, available commercially from Union Carbide under the trade names UCAR BKR-2620, and UCAR CK-1635, novolak resins and the like, and mixtures thereof. The primer may further comprise additives such as tackifying agents, antioxidants, colorants, viscosity adjusting agents, solvents and other conventional additives, which may be used in such amounts as are known in the art.

Film forming compositions with contact surfaces having a suitable force of attachment to circuit materials comprise copolymers derived from acrylate and vinyl acetate monomers.

Useful acrylates include linear or branched lower alkyl acrylate or methacrylate esters ((meth)acrylates) of non-tertiary alkyl alcohols, the alkyl groups of which have from about 4 to about 12 carbon atoms. These lower alkylates provide properties of low glass transition temperatures and when uncrosslinked are tacky in nature. Examples of acrylates and methacrylates useful in the invention include n-butyl (meth)acrylate, isooctyl (meth)acrylate, isobutyl (meth)acrylate, 1-2ethylhexyl (meth)acrylate, n-octyl (meth)acrylate, isononyl (meth)acrylate, and the like. Preferred lower alkyl (meth)acrylates include isooctyl acrylate, and 2-ethyl hexyl acrylate.

Compositions of the invention also comprise vinyl acetate monomer, and a polar monomer. Useful polar monomers include acrylic acid, n-vinyl pyrrolidone, itaconic acid, acrylamide, methacrylic acid, and the like. The preferred polar monomer is acrylic acid.

Compositions of the invention contain from about 25 to about 78 parts of a lower alkyl (meth)acrylate, from about 10 to about 60 parts of vinyl acetate, and from about 1 to about 15 parts of the polar monomer.

Preferred compositions contain 25–75, preferably around 50 parts of isooctyl acrylate, 40 parts of vinyl acetate and up to about 5 parts of acrylic acid per 100 parts of film forming composition.

Compositions of the invention are substantially crosslinked; preferred compositions have most available sites crosslinked. Useful crosslinkers include isocyanates, epoxies, aziridines, and the like.

Preferred crosslinkers include aziridines. Useful aziridines include such as trimethylolpropane-tris-($\beta$-(N-Aziridinyl)propionate), Pentaerythritol-tris-($\beta$-(N-aziridinyl)propionate), trimethylolpropane-tris-($\beta$-(N-methylaziridinyl)propionate), and the like; isocyanate, multifunctional epoxy polymers, and the like.

The film forming compositions may also include additives such as dyes, pigments, antioxidants, antistatic agents, stabilizers, and the like in such amounts as will not substantially affect the primary properties of the composition. Useful antioxidants include Irganox® 1010, available from Ciba Geigy, Nauguard® 446, a substituted aromatic amine blend available from D-Bond Trading Company, Ltd., and mixtures thereof.

Preparation of self supporting or composite films of the invention involves casting the fluid film forming compositions or applying them as coatings to a base film and thereafter heating to effect crosslinking to a point at which the contact surface exerts a force of attachment between about 1.0 oz/in (1.09N/100 mm) and about 5.0 oz/in (5.47N/100 mm) against a stainless steel plate. Using a polyimide surface in place of the stainless steel plate, the preferred force of attachment is between about 1.0 oz/in (1.09N/100 mm) and about 8.0 oz/in (8.75N/100 mm).

TEST METHODS

Attachment Force

Force of attachment is the force required to remove a coated flexible sheet attached to a test panel measured at a specific angle and rate of removal. In the examples, this force is expressed in Newtons per 100 mm width of coated sheet. The procedure followed is:

A strip 1.27 cm in width of the flexible sheet is applied to the horizontal surface of a clean glass or stainless steel test plate with at least 12.7 lineal cm in firm contact. A 2 kg hard rubber roller is used to apply the strip. The free end of the coated strip is doubled back nearly touching itself so the angle of removal will be 180°. The free end is attached to the tester scale. The test plate is clamped in the jaws of a tensile testing machine which is capable of moving the plate away from the scale at a constant rate of 2.3 meters per minute.

The scale reading in Newtons/100 mm is recorded as the test film is peeled from the test plate surface. The data are reported as the average of the range of numbers observed during the test.

Attachment force measurements were made with fresh and aged samples of composite film. Aged samples were prepared by heating the film for fifteen (15) minutes in a hot air convention oven controlled at a temperature of 150° C. Thereafter the aged films were tested as previously described.

PREPARATION OF FILM FORMING COMPOSITIONS

An isooctyl acrylate, vinyl acetate, and acrylic acid copolymer (IOA/VOAc/AA) is made as follows.

The monomers are charged to a reactor containing a 60/40 mixture of ethyl acetate/toluene. The solution is purged with nitrogen and heated to 55–60° C. with stirring. Asobisisobutyronile in ethyl acetate is added to the reactor and allowed to stir for 18 hours. The reactor is allowed to cool and the solids concentration is adjusted to 20–22% by addition of solvent mixture.

An aliquot of the solution is transferred to a suitable container for mixing and is weighed. An air stirrer is used to agitate the solution without incorporating excessive amounts of air bubbles. Triethylamine is charged to the reactor slowly and allowed to mix for at least 5 minutes after a homogeneous solution is obtained. A trifunctional aziridine, "CX-100", available from Zeneca Resins, Wilmington, Mass., is slowly added to the reactor and allowed to mix for at least 5 minutes after the solution is homogeneous. The composition is coated onto 25 $\mu$m polyethylene terephthalate (PET) using a notch bar coater with a 200 $\mu$m gap between the notch bar and the PET. The coated film is passed through a series of ovens totaling 30 ft long with three heating zones set at 104° C., 150° C. and 160° C.

Crosslinking of Film Forming Composition

Prior to casting or coating the monomer composition, previously described, initiation of thermal crosslinking required the addition of 1.2 (i.e. 1.0 to 1.5) equivalents of triethylamine per equivalent of acrylic acid, then 1.0 (i.e. 0.75 to 1.25) equivalent of trifunctional aziridine per equivalent of acrylic acid, followed by heating to a temperature between about 105° C. and about 150° C. to remove solvent and initiate crosslinking.

Example 1

| Formulation for Film Forming Composition Part A - Monomer Mixture | |
|---|---|
| Component | Parts per 100 of Film Forming Composition |
| Isooctyl acrylate | 54 |
| vinyl acetate | 40 |
| acrylic acid | 4 |

| Part B - Curative Composition | |
|---|---|
| Component | Equivalents/Equivalent of Acrylic Acid |
| triethylamine | 1.2 |
| trifunctional aziridine | 1.0 |

A composite film of the invention included a polyethylene terephthalate substrate. A composite film which was 30.5 cm wide and 25 $\mu$m thick was produced. The film-forming acrylate composition was coated 28 cm wide on the substrate by using a notch bar coater set with an 200 $\mu$m gap between the notch bar and the PET, at a rate of about 4.0 to about 6.0 meters per minute. The film forming composition included parts A and B.

After passing the coating station, the coated base film proceeded to a zoned heater having an initial zone temperature of about 105° C., an intermediate zone of about 150° C. and a terminal zone of about 1 60° C. During processing at elevated temperature the film forming coating cured to a non-tacky, clear film.

TABLE 1

| | Attachment Force | | |
|---|---|---|---|
| Example | Before Aging Newtons/100 mm | After Aging Newtons/100 mm | Surface Tested |
| 1 | 1.64 | 4.91 | Stainless Steel |
| 1 | 1.64 | 6.45 | Polyimide Film |

What is claimed is:

1. A composite tack-free film, comprising:

a film substrate having opposing surfaces, bearing on at least one of said surfaces, a highly crosslinked, film-forming acrylate composition comprising from about 25 percent by weight to about 78 percent by weight of at least one lower alkyl (meth)acrylate ester and from about 10 percent by weight to about 60 percent by weight vinyl acetate and at least about 1 percent of a polar monomer, said tack-free composite film being capable of attaching temporarily to polyimide film surface to provide a substantially air-tight seal, said composite film being removable from said polyimide film surface leaving no visible residue.

2. A composite tack-free film according to claim 1 wherein said acrylate composition comprises from about 25 percent by weight to about 78 percent by weight of a lower alkyl (meth)acrylate and from about 1 percent by weight to about 15 percent by weight of a polar monomer, and from about 10 percent by weight to about 60 percent by weight vinyl acetate.

3. A composite tack-free film according to claim 1 wherein said alkyl (meth)acrylate is selected from the group consisting of isooctyl acrylate and 2-ethyl hexyl acrylate.

4. A composite tack-free film according to claim 1 wherein said polar monomer is acrylic acid.

5. A composite tack-free film according to claim 1 further comprising a primer layer between said acrylate composition, and said film substrate.

6. A composite tack-free film according to claim 4 wherein said primer comprises a rubber compound.

7. A composite tack-free film according to claim 1 wherein said substrate is selected from the group consisting of poly(ethylene terephthalate), polyimide, polyphenylene sulfide, and fluorenone polyesters.

* * * * *